(12) United States Patent
Kim

(10) Patent No.: US 6,310,299 B1
(45) Date of Patent: Oct. 30, 2001

(54) GLASS CONNECTOR AND FABRICATING METHOD THEREOF

(75) Inventor: Seong Jin Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/112,299

(22) Filed: Jul. 9, 1998

(30) Foreign Application Priority Data

Nov. 1, 1997 (KR) .................................................. 97-57617

(51) Int. Cl.[7] .................................................... H05K 1/09
(52) U.S. Cl. ........................ 174/256; 174/260; 174/261; 361/760
(58) Field of Search ..................................... 174/255, 256, 174/257, 258, 259, 261, 260; 361/771, 779, 760

(56) References Cited

U.S. PATENT DOCUMENTS

| | | | |
|---|---|---|---|
| 4,963,002 | * | 10/1990 | Tagusa et al. ........................ 349/149 |
| 5,500,787 | * | 3/1996 | Yoshida ................................ 361/779 |
| 5,931,371 | * | 8/1999 | Pao et al. ........................ 228/180.22 |
| 6,087,597 | * | 7/2000 | Shimada et al. ..................... 174/263 |

* cited by examiner

*Primary Examiner*—Jeffrey Gaffin
*Assistant Examiner*—Jeremy Norris

(57) ABSTRACT

A glass connector that is adapted to simplify a flexible printed circuit film as well as to eliminate the delay in electrical signals. In the glass connector, a low resistance metal wiring is formed on the surface of a glass plate. A plurality of connecting bumps extending upwardly is provided on the metal wiring.

11 Claims, 6 Drawing Sheets

GLASS CONNECTOR AND FABRICATING METHOD THEREOF

BACKGROUND OF THE INVENTION

1. Field of the Invention

The present invention relates to a liquid crystal display apparatus which incorporates a "chips on glass" (COG) system in which integrated circuit (IC) chips are directly mounted onto a glass substrate. More particularly, the present invention relates to a glass connector for applying signals to the IC chips and a method of making such a liquid crystal display apparatus.

2. Description of Related Art

Since a liquid crystal display apparatus has advantages including being light weight, having a low small thickness, low power consumption and so on, its applications have steadily increased. A liquid crystal display apparatus includes a picture display having picture elements or pixels of liquid crystal arranged in a matrix pattern, and driving IC chips, (hereinafter referred to as D-IC chips), for driving the liquid crystal display. Recently, a liquid crystal display apparatus has been manufactured using the COG system in which D-IC chips are directly mounted on the edge of a glass substrate. Also, the COG type liquid crystal panel makes use of a flexible printed circuit (FPC) film for applying signals to the D-IC chips. The FPC film is adhered onto the glass substrate using a conductive resin. The FPC film includes a single conductive layer or multiple conductive layers made from a metal material interposed between a soft or flexible material layer such as polyimide.

However, the FPC film having multiple conductive layers increases the manufacturing cost of the liquid crystal display apparatus and causes an unstable and unreliable electrical connection with the glass substrate. On the other hand, the single conductive layer of the FPC film is used with separate wiring provided on the glass substrate, so that it is capable of reducing the manufacturing cost of the liquid crystal display apparatus. However it may cause problems of poor connection, signal delay and so on. The problems in the COG type liquid crystal display apparatus using such FPC films will be more apparent from the following description with reference to FIG. 1 to FIG. 4.

FIG. 1 schematically illustrates a conventional COG type liquid crystal display apparatus using FPC films 8A and 8B each having two conductive layers. FIG. 2 is a sectional view of the liquid crystal display apparatus taken along line A–A' in FIG. 1. As shown in FIG. 1, the COG type liquid crystal display apparatus includes an upper glass substrate 4 provided on top of a lower glass substrate 2, gate driving IC chips 6 mounted on the right edge of the lower glass substrate 2, and data driving IC chips 10 mounted on the lower edge of the lower glass substrate 2. Each pixel consisting of liquid crystal cells and thin film transistors TFTs is formed between the lower glass substrate 2 and the upper glass substrate 4 in a matrix pattern. The gate D-IC chips 6 apply gate control signals to gate electrodes included in the pixel matrix, thereby driving the TFTS. The data D-IC chips 10 apply data signals to the source electrodes included in the pixel matrix, thereby controlling the light transmissivity of liquid crystal cells. The pixel matrix displays a picture corresponding to video signals supplied via the gate D-IC chips 6 and the data D-IC chips 10.

Further, gate FPC film 8A is provided at the right edge of the lower glass substrate 2 and is located adjacent to the gate D-IC chips 6. Data FPC film 8B is provided at the lower edge of the lower glass substrate 2 and located adjacent to the data D-IC chips 10. The gate FPC film 8A transfers electrical signals including timing control signals, voltage signals and so on from the control circuitry (not shown) to the gate D-IC chips 6. The data FPC film 8B transfers electrical signals including timing control signals, video signals, voltage signals and so on from the control circuitry to the data D-IC chips 10. In order to transfer so many signals, the gate FPC film 8A and the data FPC film 8B each usually has two conductive layers, but can have more than four conductive layers when the number of electrical signals is above 40.

FIG. 2 illustrates a section of the COG type liquid crystal display apparatus taken along line II—II in FIG. 1. As shown in FIG. 2, the D-IC chip 6 is mounted between the upper glass substrate 4 and the FPC film 8A. Also, the D-IC chip 6 is electrically connected to an input wiring electrode 14 and the output wiring electrode 16 via an anisotropic conductive film 18. The FPC film 8A consists of a first conductive layer 20 and a second conductive layer 22 provided at the lower surface and the upper surface of a base film 26, respectively. A protective film 24 is wound around the base film 26 and the first and second conductive layers 20 and 22. At this time, one end of the first conductive layer 20 and one end of the second conductive layer 22 are left exposed by the protective film 24. The exposed end of the first conductive layer 20 is electrically connected to an input pad via the anisotropic conductive film 18. The second conductive layer 22 is electrically connected to the first conductive layer 20 via a contact 28 passing through the base film 26.

A multiple layer structure of the FPC film installed at the edge of the lower glass substrate increases the manufacturing cost as a portion adhered to the lower glass substrate is lengthened and as the number of conductive layers increases. Also, it is difficult to arrange the FPC film on the lower glass substrate because of its high degree of softness or flexibility. In addition, the FPC film causes a poor connection produced by a thermal impact because the base film has a much greater thermal expansion coefficient than the glass substrate. Such a poor connection frequently occurs due to a large tolerance occurring when conductive layers having a thickness above 18 mm are patterned.

Accordingly, a COG type liquid crystal display apparatus has been suggested as shown in FIG. 3 that uses a single layer of FPC film instead of the multiple layer structure of the FPC film causing the above problems.

Referring now to FIG. 3, another COG type liquid crystal display apparatus includes a first signal wiring 30 provided at the right edge of a lower glass substrate 2, second signal wiring 32 provided at the lower edge of the lower glass substrate 2, and a FPC film 8 provided at the lower right corner of the lower glass substrate 2 so as to be electrically connected to first and second signal wirings 30 and 32. First signal wiring 30 is connected to gate D-IC chips 6 disposed between an upper glass substrate 4 and the first signal wiring 30 to transfer electrical signals from the FPC film 8 to the gate D-IC chips 6. Likewise, second signal wiring 32 is connected to the data D-IC chips 10 disposed between the upper glass substrate 4 and the second wiring 32 to transfer electrical signals from the FPC film 8 to the data D-IC chips 10.

The FPC film 8 is electrically connected to control circuitry (not shown) via a mechanical device, e.g., a connector. Also, the FPC film 8 includes only one conductive layer because it is not connected to the gate D-IC chips 6 and the data D-IC chips 10. As a result, the COG type liquid crystal display apparatus is capable of reducing the manufacturing cost of the FPC film and therefore, the overall manufacturing cost of the COG type liquid crystal display apparatus, while also significantly reducing poor electrical connections.

FIG. 4 illustrates a section of the COG type liquid crystal display apparatus taken along line IV—IV in FIG. 3. The D-IC chip 6 is electrically connected to an input wiring electrode 14 and an output wiring electrode 16 via an anisotropic conductive film 18. The signal wiring 30 is positioned at the upper portion of the input wiring electrode 14. An insulating layer 34 is disposed between the signal wiring 30 and the input wiring electrode 14. A protective film 36 is coated on the signal wiring 30 and the upper portion of the exposed insulating layer 34. Further, the signal wiring 30 is electrically connected to the input wiring electrode 14 via a contact which passes through the insulating layer 34.

As described above, the signal wiring positioned at the upper portion of the input wiring electrode 14 is made from a high resistance material having a resistance equal to the resistance of the material used to form the gate, the source and the drain of the TFT. Further, the insulating layer 34 for electrically separating the input wiring electrode 14 from the signal wiring 30 is provided with a capacitor located between the input wiring 30 electrode 14 and the signal wiring. As a result, it is impossible to avoid delay in delivery of electrical signals to be delivered via the signal wiring to the D-IC chips. Also, poor connections between the input wiring electrode 30 and the signal wiring 14 occur as a result of a poor quality of contact and a poor deposition of the insulating film.

SUMMARY OF THE INVENTION

The preferred embodiments of the present invention overcome the problems described above by providing a glass connector that is adapted to simplify a FPC film and to eliminate the delay in electrical signals, and a method for manufacturing such a glass connector.

The preferred embodiments of the present invention also provide a liquid crystal display apparatus that is adapted to simplify a FPC film and to eliminate delay in electrical signals and to provide a method of mounting a novel glass connector on a glass substrate.

According to one aspect of preferred embodiments of the present invention, a liquid crystal display apparatus includes a novel glass connector having a wiring disposed on the surface of a glass plate and a plurality of connecting bumps extending from the wiring.

According to another aspect of preferred embodiments of the present invention, a method of manufacturing a glass connector includes the steps of preparing a glass plate, forming a wiring on the surface of the glass plate, and forming a plurality of bumps on the wiring.

According to still another aspect of preferred embodiments of the present invention, a liquid crystal display apparatus has a pixel matrix including pixels and a glass substrate including driving integrated circuit chips for driving the pixel matrix mounted thereon, a flexible printed circuit film for applying electrical signals to the driving integrated circuit chips, and a glass connector mounted on the glass substrate to transfer the electrical signals from the flexible integrated circuit film to the driving integrated circuit chips.

According to still another aspect of preferred embodiments of the present invention, a method of mounting a glass connector includes the steps of adhering an isotropic conductive film on a glass substrate on which wiring electrodes are provided and pressing a glass connector having a plurality of bumps extending from the wiring electrodes into the anisotropic conductive film.

Other features and advantages of the present invention will become apparent from the following description of preferred embodiments of the invention which refers to the accompanying drawings, wherein like reference numerals indicate like elements to avoid duplicative description.

DETAILED DESCRIPTION OF THE PREFERRED EMBODIMENTS

Figure 1:
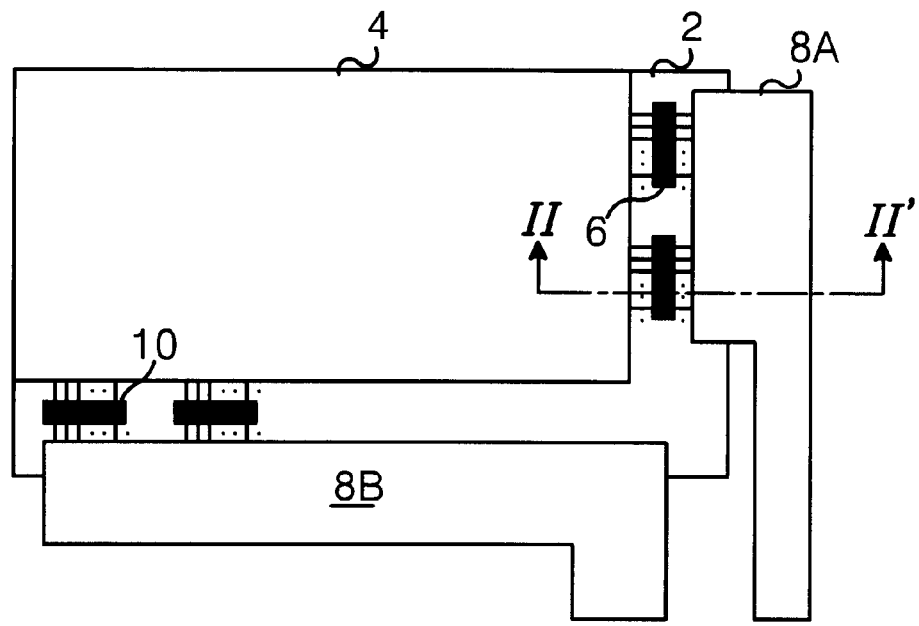
FIG. 1 schematically shows a configuration of a conventional liquid crystal display apparatus incorporating a "chips on glass" (COG) system and a two layer structure of a FPC film.
Figure 2:
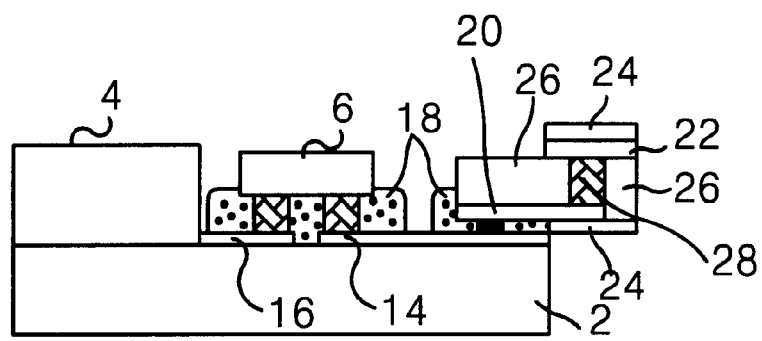
FIG. 2 is a sectional view of the COG type liquid crystal display apparatus taken along line II—II in FIG. 1.
Figure 3:
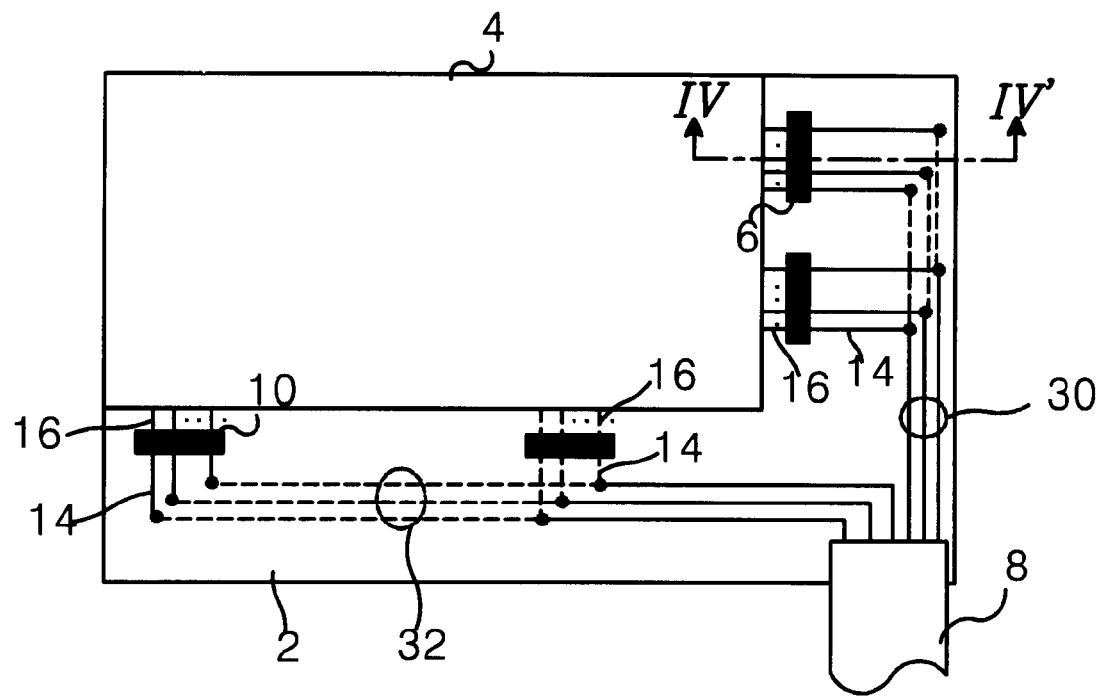
FIG. 3 schematically shows a configuration of a conventional COG type liquid crystal display apparatus using a single layer structure of the FPC film.
Figure 4:
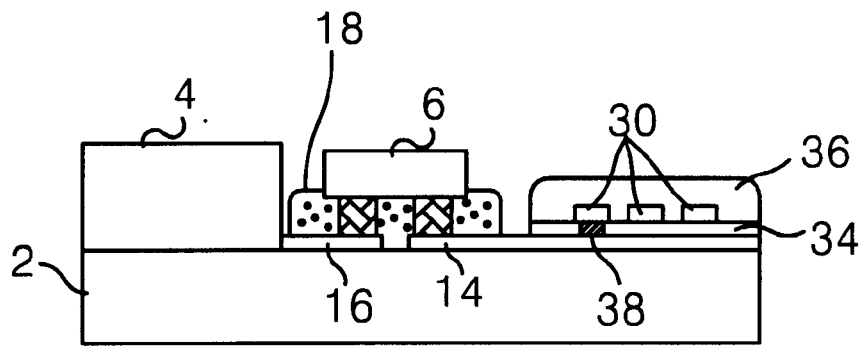
FIG. 4 is a sectional view of the COG type liquid crystal display apparatus taken along line IV—IV in FIG. 3.
Figure 5:
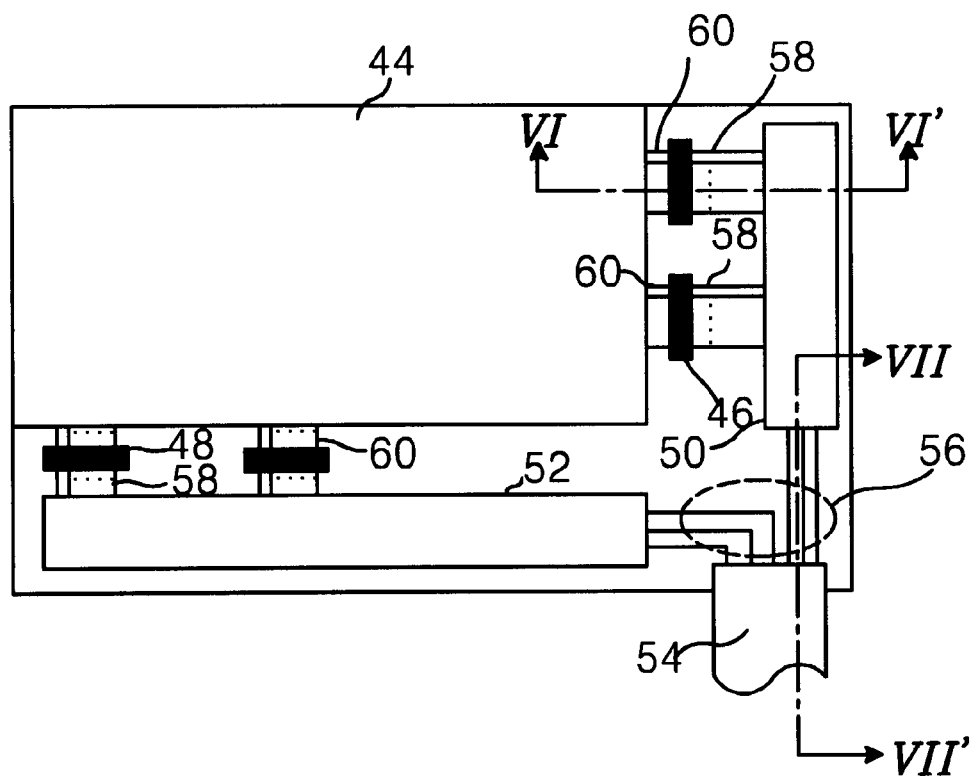
FIG. 5 schematically shows a configuration of a COG type liquid crystal display apparatus according to a preferred embodiment of the present invention.

Referring to FIG. 5, there is shown a COG type liquid crystal display apparatus according to a preferred embodiment of the present invention is shown that includes an upper glass substrate 44 arranged to face the upper portion of a lower glass substrate 42, gate D-IC chips 46 mounted on the right edge of the lower glass substrate 42, and data D-IC chips 48 mounted on the left edge of the lower glass substrate 42. Each pixel includes liquid crystal cells and thin film transistors TFTs located between the lower glass substrate 42 and the upper glass substrate 44 arranged in a matrix pattern. The gate D-IC chips 46 apply gate control signals to gate electrodes included in the pixel matrix, thereby driving the TFTs. The data D-IC chips 48 apply data signals to source electrodes included in the pixel matrix, thereby controlling the light transmissivity of liquid crystal cells. The pixel matrix displays a picture corresponding to video signals via the gate and data D-IC chips 46 and 48.

The liquid crystal display apparatus further includes a gate glass connector 50 provided at the right edge of the lower glass substrate 42. The glass connector 50 is preferably arranged in such a manner to be adjacent to the gate D-ICs 46. A data glass connector 52 is provided at the lower edge of the lower glass substrate 42 in such a manner to be adjacent to the data D-IC chips 48, and a FPC film 54 is adhered to the lower right corner of the lower glass substrate 42.

The gate glass connector 50 commonly applies electrical signals received via signal input electrodes 56 from the FPC film 54 to the gate D-IC chips 46. The electrical signals transferred by the gate glass connector 50 include timing control signals, voltage signals and so on.

Figure 6:
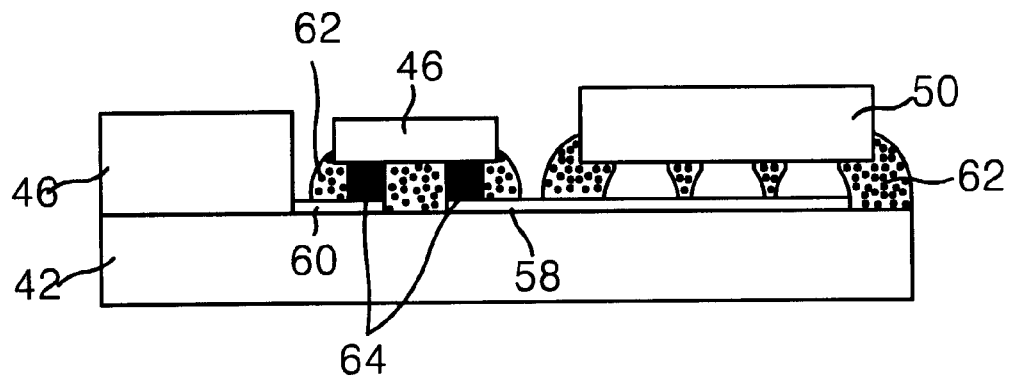
FIG. 6 is a sectional view of the liquid crystal display apparatus taken along line VI—VI in FIG. 5.
Figure 7:
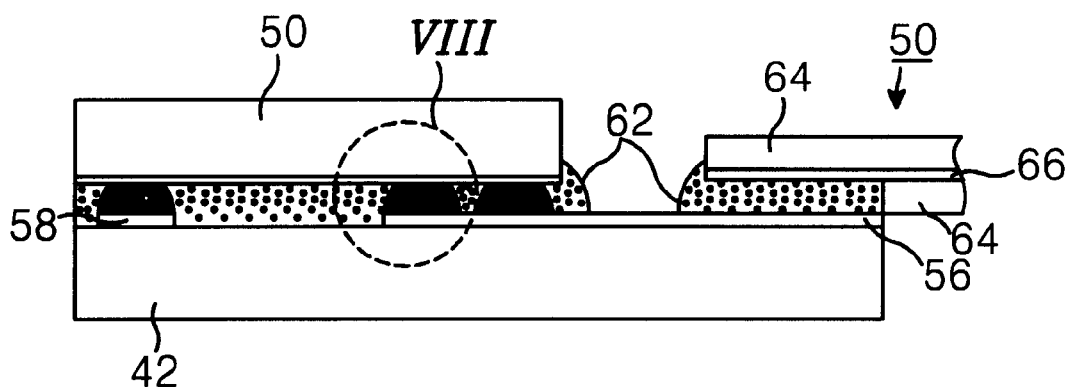
FIG. 7 is a sectional view of the liquid crystal display apparatus taken along line VII—VII in FIG. 5.

To this end, the gate glass connector 50 is adhered to the right edge of the lower glass substrate 42 using anisotropic conductive films 62 in such a manner to be electrically connected to input wiring electrodes 58 as shown in FIG. 6, and to signal input electrodes 56 as shown in FIG. 7. Referring to FIG. 6, the gate D-IC chip 46 is connected to the input wiring electrode 58 and an output wiring electrode 60 by means of the anisotropic conductive films 62 and bumps 64.

Figure 8:
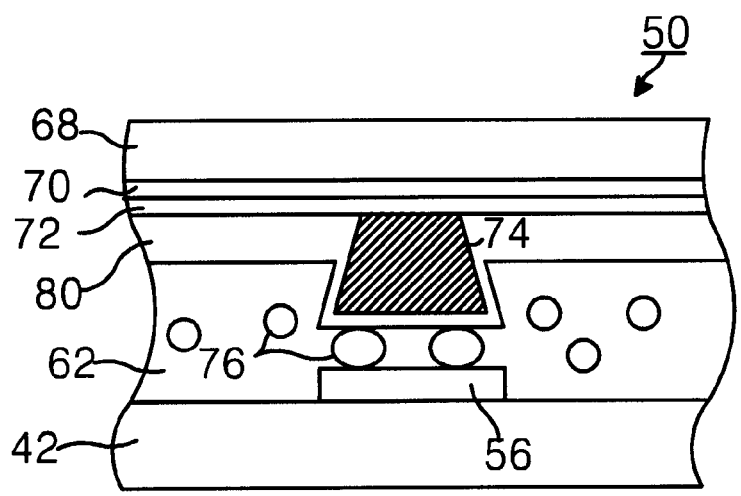
FIG. 8 is an enlarged view of the circle VIII portion in the FIG. 7.

As shown in FIG. 8, the gate glass connector 50 includes first and second conductive layer patterns 70 and 72 sequentially formed at the lower surface of a glass plate 68, and a connecting bump 74 downwardly extending from the second conductive layer 72. A conductive film 80 is coated on the surfaces of the second conductive layer pattern 72 and the connecting bump 74. The first and second conductive layer patterns 70 and 72 form wiring for delivering signals, and the connecting bump 74 connects the wiring to the signal input electrode 56 or the wiring input electrode 58.

In this case, the connecting bump 74 is electrically connected, via conductive particles, i.e., conductive balls 76 included in the anisotropic conductive film 62, to the signal input electrode 56 defined on the lower glass substrate 42.

On the other hand, the data glass connector 52 commonly applies electrical signals received, via the signal input electrodes 56, from the FPC film 54 to the data D-IC chips 48. The electrical signals transferred through the data glass connector 52 include timing control signals, voltage signals and so on. To this end, the data glass connector 52 is fabricated in the similar form to the gate glass connector 50 and connected to the data D-IC chips 48 and the signal input wiring 56 in the similar manner to the gate glass connector 50.

The FPC film 54 applies many electrical signals including timing control signals, voltage signals and so on from a control circuitry, (not shown), to the gate glass connector 50 and the data glass connector 52. To this end, the FPC film 54 has one end electrically adhered into the signal input electrodes 56 defined at the corner of the right lower end of the lower glass substrate 42 by means of the anisotropic conductive films 62 as shown in FIG. 7. Also, the FPC film 54 has other end electrically connected to control circuitry (not shown) by means of a mechanical device. As shown in FIG. 7, such a FPC film 54 includes a single conductive layer 66 surrounded by a soft material film 64 such as polyimide. The signal input electrodes 56 are made from the same high resistance material as the gate, drain and source of the FET, and delivers electrical signals from the FPC film 54 to the gate glass connector 50 and the data glass connector 52.

Figure 9A:
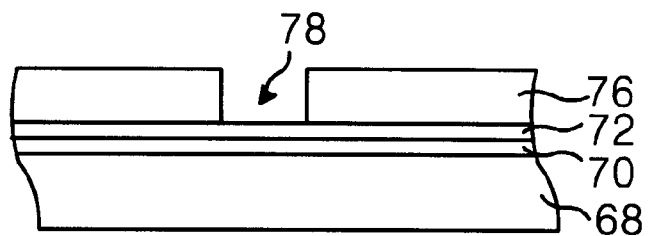
FIG. 9A to FIG. 9C are sectional views for explaining a glass connector manufacturing method according to a preferred embodiment of the present invention.
Figure 9B:
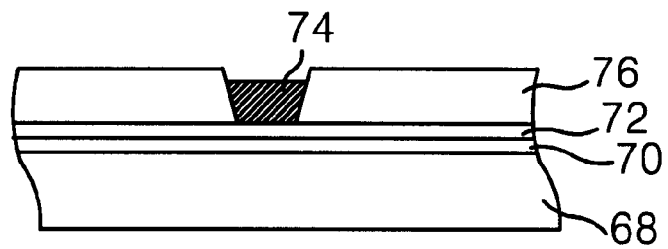
Figure 9C:
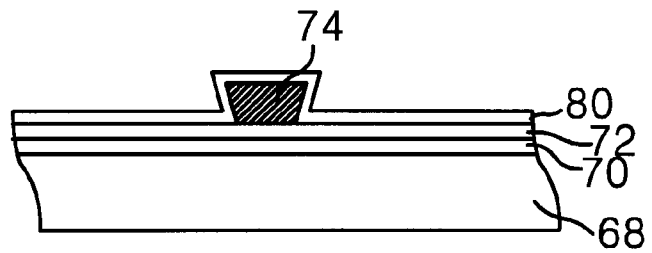

FIG. 9A to FIG. 9C are sectional views for stepwise explaining a process of fabricating a glass connector accordingly to an embodiment of the present invention. Referring now to FIG. 9A, the first conductive layer pattern 70 and the second conductive layer pattern 72 are sequentially disposed on glass plate 68. The first conductive layer pattern 70 is formed by depositing a first metal material, such as Cu, Cr or mixture thereof, on the glass plate 68 and then patterning the deposited first metal material layer using a photolithography etching technique. The second conductive layer pattern 72 is formed by depositing a second metal material, such as Au, on the entire surface of the glass plate 68 having the first conductive layer pattern 70, and then by patterning the second metal material layer using the photolithography etching technique.

Subsequently, as shown in FIG. 9B, a photo-resist film 76 is formed on the glass plate 68 having deposited the first and second conductive layer patterns 70 and 72 as described above. A contact hole 78 is formed in such a manner that the photo-resist film 76 is partially exposed to light and developed, thereby having a very steep slope of wall surfaces. This contact hole 78 exposes a part of the second conductive layer pattern 72.

As shown in FIG. 9C, the steep wall surfaces of the contact hole 78 becomes slow by making a hard baking of the photo-resist 76. Then, the second metal material is deposited in the contact hole 78 to define 9 connecting bump 74 in a shape of funnel. The connecting bump 74 formed in this manner has a height of at least 25 μm. To this end, the photo-resist 76 is coated into a thickness of at least 25 μm.

Subsequently, the photo-resist 76 is removed to expose the connecting bump 74, the first and second conductive layer patterns 70 and 72 and the glass substrate 68. A uniformly thick, e.g., 1 to 3 μm, of conductive film 80 made from the second metal material is formed over the connecting bump 74 and the second conductive layer pattern 72.

Figure 10:
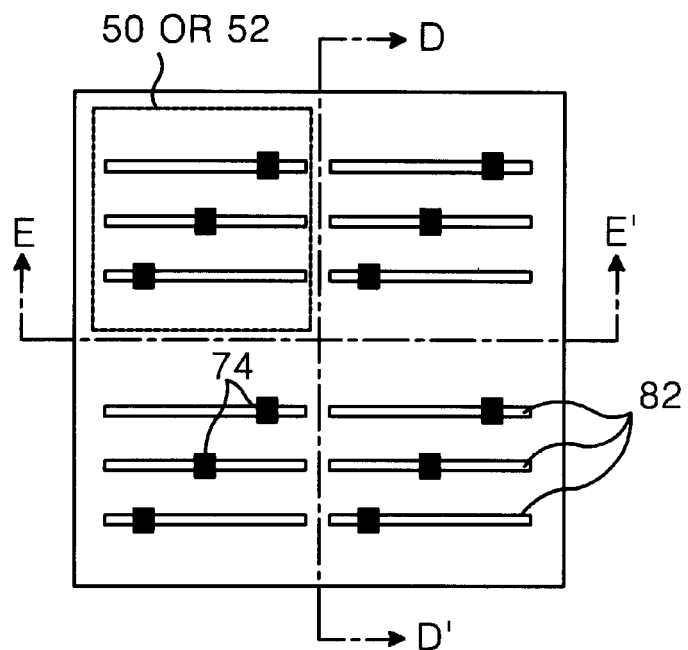
FIG. 10 shows an arrangement in a glass connector array made according to the glass connector manufacturing method according to a preferred embodiment of the present invention.

FIG. 10 shows a glass connector array provided using the fabricating process of FIG. 9A to FIG. 9C as mentioned above. Referring now to FIG. 10, four glass connectors 50 or 52 are formed on one glass plate 68. These four glass connectors 50 or 52 are separated by cutting the glass plate 68 along lines D–D' and E–E'. Three conductive lines 82 are provided in each glass connector 50 or 52, and a connecting bump 74 is provided in each conductive line 82.

Figure 11:
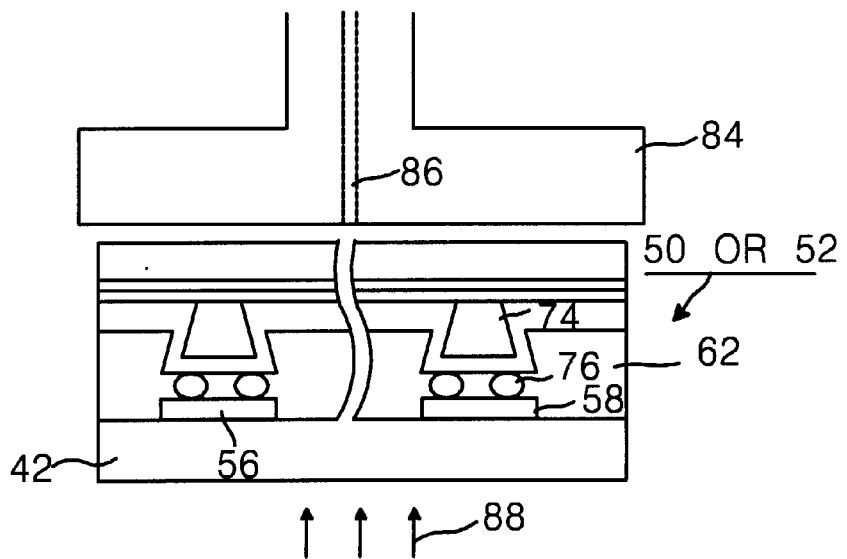
FIG. 11 is a view for explaining a glass connector mounting method according to another preferred embodiment of the present invention.

FIG. 11 illustrates a process of adhering the glass connector 50 or 52 to the lower glass substrate 42. Referring to FIG. 11, the anisotropic conductive film 62 is formed over the signal input wiring 56 and the output wiring electrode on the lower glass substrate 42. Then, the glass connector 50 or 52 is vacuum adhered to the bottom surface of a bonding tool 84 in such a manner that the bumps 74 are directed downwardly. To this end, an air exhausting hole 86 is formed in the center of the bonding tool 84. Air is upwardly exhausted through the air exhausting hole 86 to vacuum adhere the glass connector 50 or 52 onto the lower surface of the bonding tool 84.

Subsequently, the anisotropic conductive film 62 allows the anisotropic film to be pressed onto the glass connector 50 or 52 and the lower glass substrate 42 by lowering the bonding tool 84 while irradiating infrared rays 88 onto the bottom surface of the lower glass substrate 42. The anisotropic conductive film 62 is pressed into the glass connector 50 or 52 and the lower glass substrate 42 in this manner, thereby adhering the glass connector 50 or 52 to the lower glass substrate 42. At this time, the bumps 74 are electrically connected to the signal input electrode 56 or the input wiring electrode 58 by means of conductive materials, i.e., conductive Particles 76 contained in the anisotropic conductive film 62.

As described above, in a glass connector according to the present invention, wiring is made from a low resistance metal material so that signals transferred by means of the D-IC chips is not delayed significantly. Accordingly, the glass connector according to the present invention can make a fine formation of the wiring using the semiconductor fabrication process to implement a complex wiring. Also, the glass connector can be deformed into the same thermal expansion coefficient as the lower glass substrate by a thermal impact, thereby eliminating poor connections due to the thermal impact. As a result, the glass connector according to the present invention is capable of simplifying the FPC film as well as of reducing a fabricating cost of the FPC and thus a manufacturing cost of the liquid crystal display apparatus.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A glass connector comprising:
   a wiring formed on a first glass plate;
   a plurality of connecting bumps extending from the wiring; and
   a second glass plate arranged such that the connecting bumps are disposed between the first and second glass plates.

2. The glass connector as claimed in claim 1, wherein the wiring is made of at least two conductive layers of different materials.

3. The glass connector as claimed in claim 1, wherein said wiring includes:
   a first conductive layer pattern made from any one of Cu, Cr and a mixture thereof in such a manner to be disposed on the first glass plate; and
   a second conductive pattern made from Au in such a manner to be superposed with the first conductive layer pattern.

4. The glass connector as claimed in claim 1, further comprising a low resistance conductive film coated on the surfaces of the wiring and the connecting bumps.

5. The glass connector as claimed in claim 4, wherein the conductive film is made from Au.

6. A chips-on-glass (COG) type liquid crystal display apparatus comprising:
   a liquid crystal panel including pixels arranged in a matrix form;
   at least one gate driving IC (D-IC) chip for applying gate signals to the picture display;
   at least one data D-IC chip for applying data signals to the picture display;
   a gate glass connector for routing signals from a first subset of a plurality of signal input electrodes to the gate D-IC chip; and
   a data glass connector for routing signals from a second subset of the plurality of signal input electrodes to the data D-IC chip.

7. The apparatus of claim 6, wherein the gate and data glass connectors each comprises:
   a wiring formed on a first glass plate;
   a plurality of connecting bumps extending from the wiring; and
   a second glass plate arranged such that the connecting bumps are disposed between the first and second glass plates.

8. The apparatus of claim 7, wherein the wiring is made of at least two conductive layers of different materials.

9. The apparatus of claim 7, wherein said wiring includes:
   a first conductive layer pattern made from any one of Cu, Cr and a mixture thereof in such a manner to be disposed on the first glass plate; and
   a second conductive pattern made from Au in such a manner to be superposed with the first conductive layer pattern.

10. The apparatus of claim 7, further comprising a low resistance conductive film coated on the surfaces of the wiring and the connecting bumps.

11. The apparatus of claim 10, wherein the conductive film is made from Au.

* * * * *